US012406901B2

(12) United States Patent
Micovic et al.

(10) Patent No.: US 12,406,901 B2
(45) Date of Patent: Sep. 2, 2025

(54) WAFER-SCALE DIRECT BONDED ARRAY CORE BLOCK FOR AN ACTIVE ELECTRONICALLY STEERABLE ARRAY (AESA)

(71) Applicant: Raytheon Company, Arlington, VA (US)

(72) Inventors: Miroslav Micovic, Marana, AZ (US); Karen Kaneko Baker, Tucson, AZ (US); Christopher Carbonneau, Marana, AZ (US); Katherine J. Herrick, Tucson, AZ (US); Teresa J. Clement, Tucson, AZ (US); Jeffrey R. Laroche, Andover, MA (US)

(73) Assignee: Raytheon Company, Arlington, VA (US)

( * ) Notice: Subject to any disclaimer, the term of this patent is extended or adjusted under 35 U.S.C. 154(b) by 955 days.

(21) Appl. No.: 17/465,633

(22) Filed: Sep. 2, 2021

(65) Prior Publication Data
US 2023/0065622 A1 Mar. 2, 2023

(51) Int. Cl.
*H01L 23/427* (2006.01)
*H01L 23/00* (2006.01)
(Continued)

(52) U.S. Cl.
CPC ............ *H01L 23/427* (2013.01); *H01L 24/08* (2013.01); *H01L 24/80* (2013.01);
(Continued)

(58) Field of Classification Search
CPC .. H01P 3/088; H01L 23/66; H01L 2223/6677; H01L 2224/08145;
(Continued)

(56) References Cited

U.S. PATENT DOCUMENTS 6,190,778 B1 2/2001 Batz-sohn et al.
6,500,694 B1 12/2002 Enquist
(Continued)

FOREIGN PATENT DOCUMENTS

CN 103457015 4/2015
CN 111769088 1/2021
(Continued)

OTHER PUBLICATIONS

T. Tokumitsu, "K-band and millimeter-wave MMICs for emerging commercial wireless applications," 2000 Asia-Pacific Microwave Conference. Proceedings (Cat. No.00TH8522), Sydney, NSW, Australia, 2000, pp. 648-653, doi: 10.1109/APMC.2000.925917. (Year: 2000).*

(Continued)

*Primary Examiner* — Olumide Ajibade Akonai
(74) *Attorney, Agent, or Firm* — Schwegman Lundberg & Woessner, P.A.

(57) ABSTRACT

An Array Core Block for an AESA includes a stack of 2*M alternating N-channel RFIC and MMIC Power Amplifier wafers bonded together by a wafer-scale direct bond hybrid (DBH) interconnect process. This process forms both metal-to-metal and dielectric hydrogen bonds between bonding surfaces to seal the wafer stack. Each array core block includes an array of through substrate metal vias to distribute DC bias, LO and information signals. Each array core block also includes a cooling system including micro-channels formed on a backside of at least one of the chips in each bonded pair and through substrate via holes formed through the stack that operatively couple the micro-channels for all of the bonded pairs to receive and circulate a fluid through the micro-channels and through substrate via holes to cool the RFIC and MMIC Power Amplifier chips and to extract the heated fluid.

20 Claims, 15 Drawing Sheets

(51) Int. Cl.
  *H01L 25/00* (2006.01)
  *H01L 25/065* (2023.01)
  *H01Q 3/24* (2006.01)
  *H03F 3/24* (2006.01)

(52) U.S. Cl.
  CPC .......... *H01L 25/0657* (2013.01); *H01L 25/50* (2013.01); *H01Q 3/24* (2013.01); *H03F 3/245* (2013.01); *H01L 2224/08145* (2013.01); *H01L 2224/80895* (2013.01); *H01L 2224/80896* (2013.01); *H01L 2225/06589* (2013.01); *H03F 2200/447* (2013.01); *H03F 2200/451* (2013.01)

(58) Field of Classification Search
  CPC ......... H01L 2224/80895; H01L 23/427; H01L 2225/06589; H01L 25/0657; H01L 24/94; H01L 23/473; H01L 2924/1423; H01L 2223/6683; H01Q 21/0025; H01Q 21/0093; H04B 1/036; H04B 7/0617; H05K 1/0272

See application file for complete search history.

(56) References Cited

U.S. PATENT DOCUMENTS

| | | | |
|---|---|---|---|
| 6,962,835 B2 | 11/2005 | Tong et al. | |
| 7,266,267 B2 | 9/2007 | Bakir et al. | |
| 7,567,090 B2* | 7/2009 | Cote ................. | G01R 31/2877 324/750.2 |
| 8,077,464 B2* | 12/2011 | Brok ..................... | H01L 23/467 361/698 |
| 8,617,927 B1* | 12/2013 | Margomenos .......... | H01L 25/16 257/713 |
| 8,921,992 B2 | 12/2014 | Koontz et al. | |
| 9,991,593 B1* | 6/2018 | Hill ....................... | H01Q 3/2676 |
| 10,541,461 B2 | 1/2020 | Teshiba et al. | |
| 10,684,662 B2* | 6/2020 | Moore ................. | H05K 9/0007 |
| 11,018,425 B1* | 5/2021 | Hageman ............... | H01Q 3/267 |
| 11,393,789 B2* | 7/2022 | Lan .......................... | H01L 25/50 |
| 2008/0179736 A1* | 7/2008 | Hartwell ............... | H01L 23/473 257/E23.098 |
| 2012/0313818 A1* | 12/2012 | Puzella ................... | H01Q 1/02 342/371 |
| 2018/0175476 A1 | 6/2018 | Teshiba et al. | |
| 2018/0198204 A1 | 7/2018 | Kovacic | |

FOREIGN PATENT DOCUMENTS

| | | |
|---|---|---|
| JP | 2003298332 | 10/2003 |
| JP | 2005117108 | 4/2005 |
| JP | 2010507929 | 3/2010 |
| JP | 2010514373 | 4/2010 |
| JP | 7666829 | 4/2025 |
| WO | 2023034520 | 3/2023 |

OTHER PUBLICATIONS

"International Application Serial No. PCT US2022 042371, International Search Report mailed Dec. 20, 2022", 4 pgs.

"International Application Serial No. PCT US2022 042371, Written Opinion mailed Dec. 20, 2022", 7 pgs.

"International Application Serial No. PCT US2022 042371, International Preliminary Report on Patentability mailed Mar. 14, 2024", 9 pgs.

Bakir, Muhannad S., et al., "3D heterogeneous integrated systems: Liquid cooling, power delivery, and implementation", 2008 IEEE Custom Integrated Circuits Conference, (2008), 663-670.

Hancock, Timothy M., et al., "Heterogeneous and 3D Integration at DARPA", 2019 International 3D Systems Integration Conference (3DIC), (2019), 1-4.

Mudrick, John P., et al., "Sub-10 μm Pitch Hybrid Direct Bond Interconnect Development for Die-to-Die Hybridization", 2019 IEEE 69th Electronic Components and Technology Conference (ECTC), (2019), 648-654.

Radisic, Vesna, et al., "220-GHz Solid-State Power Amplifier Modules", IEEE Journal of Solid-State Circuits, vol. 47, No. 10, (Oct. 2012), 2291-2297.

Shahramian, Shahriar, et al., "A Fully Integrated 384-Element, 16-Tile, W-Band Phased Array With Self-Alignment and Self-Test", IEEE Journal of Solid-State Circuits, vol. 54, No. 9, (Sep. 2019), 2419-2434.

"European Application Serial No. 22778125.9, Response Filed Aug. 30, 2024 to Communication pursuant to Rules 161(1) and 162 EPC mailed Apr. 9, 2024.", 43 pgs.

"Korean Application Serial No. 10-2024-7010253, Notice of Preliminary Rejection mailed Feb. 27, 2025", With English Machine Translation, 9 pgs.

"Korean Application Serial No. 10-2024-7010253, Response filed Apr. 30, 2025 to Notice of Preliminary Rejection mailed Feb. 27, 2025", W English Claims, 23 pgs.

\* cited by examiner

WAFER-SCALE DIRECT BONDED ARRAY CORE BLOCK FOR AN ACTIVE ELECTRONICALLY STEERABLE ARRAY (AESA)

BACKGROUND OF THE INVENTION

Field of the Invention

This invention relates to Active Electronically Steerable Arrays (AESAs) and more particularly to an Array Core Block fabricated using a wafer-scale direct bond hybrid (DBH) interconnect process to facilitate the integration of high-power III-V Monolithic Millimeter-wave Integrated Circuit (MMIC) Power Amplifiers with Silicon based Radio Frequency Integrated Circuits (RFICs).

Description of the Related Art

An AESA is a phased array system consisting of an M×N array of fixed antenna elements with an active RF power amplifier and an active beam forming circuit behind every antenna element. Each antenna element is excited with an RF signal. The relative phases of the excitation signals are controlled to form and steer an RE beam.

AESA architectures operating at 50 GHz and above are based on a tile architecture. Examples of this architecture can be found in a paper 'Fully Integrated 384 element 16 Tile W-band Phase Array with Self-Alignment and Self-Test' by S. Shahramian et al., IEEE Journal of Solid State Circuits, Vol, 54, No. 9, pp 2419-2433, and U.S. Pat. No. 10,541,461 and in references therein. These architectures utilize SiGe or CMOS RFIC chip tiles that contain an array of fully integrated transceiver circuits that provide signal up/down conversion, power amplification and beam-forming functions. These highly complex functions can be readily implemented in Si RFIC's within a small chip area, due to tight design rules and high integration density provided by advanced Si chip fabrication techniques. These tiles typically contain between 4×4 and 8×8 elements. The dimension of the tiles is compatible with half wavelength element spacing at the operating frequency. The RFIC array tiles are flip-chip attached to the antenna array plate that is typically implemented in multilayer printed circuit board or multilayer ceramic or quartz. The antenna array plate also provides an interface for RFIC bias, routing of IF and LO signals and for communication and control of individual array elements. Heat is pulled out through the bottom of the tiles through a heat sink.

These tile-based architectures are not compatible with integration with high power Gallium Nitride (GaN) MMIC Power Amplifier chips, which can produce 100× more RF power per chip area than Si RFIC, but do not provide the same level of integration as Si RFICs. The GaN chips are made of a different material system that cannot be easily integrated into the Si-based RFIC chip. The tile architecture cannot handle heat loads generated by high power GaN MIMIC PA's, and cannot provide DC power distribution capacity to power GaN MMIC PA's.

Timothy M. Hancock et. al., "Heterogeneous and 3D Integration at DARPA", 2019 International 3D Systems Integration Conference (3DIC) describes techniques for integrating Si CMOS with InP, GaN and GaAs for use in wideband RF and mixed-signal systems. As shown in FIG. 2 of T. M. Hancock, a Northrop Grumman Diverse Accessible Heterogeneous Integration (DAHI) process stacks chipless of GaN HEMTs on top of CMOS. The GaN chips are bonded face up to allow the SiC substrate of the GaN to be a heat spreader below the device channel before moving the heat into the silicon CMOS substrate. Heat is pulled out the bottom of the stack through the Si CMOS substrate.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a high-power array core block for an AESA for operating frequencies above 50 GHz. The array core block includes a stack of 2*M alternating N-channel RFIC and MMIC Power Amplifier chips bonded together by a wafer-scale direct bond interconnect process to form M bonded pairs of an M×N element array core block where M and N are integers greater than one. An array of through substrate metal vias extend vertically through the stack to (a) distribute a DC bias to the MMIC Power Amplifier chips and local oscillator (U)) and information signals to the RFIC chips and (b) connect the N output channels of the RFIC chip to drive corresponding input channels of the MIMIC Power Amplifier chip to drive respective antenna elements integrated on the MIMIC Power Amplifier such that the M×N element array core block forms a steerable RF beam at the operating frequency. A cooling system includes micro-channels formed on a backside of at least one of the chips in each bonded pair and through substrate via holes formed through the stack that operatively couple the micro-channels for all of the bonded pairs to receive and circulate a fluid through the micro-channels and through substrate via holes to cool the RFIC and MMIC Power Amplifier chips and to extract the heated fluid.

The wafer-scale direct bond hybrid (DBH) (dielectric/metal) interconnect process forms both a hydrogen bond between dielectric layers and a strong metal-to-metal thermal diffusion bond between the wafers. These bonds form a strong mechanical connection and a seal through the stack to contain the circulating fluid. A Direct Bond Hybridization (DBH) process forms a hydrogen bond between opposing SiO2 bonding dielectric layers and a mechanical bond between opposing metal plugs.

In an embodiment, the M×N element array core block includes at least M=1 and N=4 elements. Typical block sizes may range between 1×8 elements and 16×16 elements.

In an embodiment, the LO and information signals are distributed at frequencies less than 10% of the operating figure. The RFIC chip is configured to upconvert the LO to the operating frequency.

In an embodiment, the cooling system is configured to receive and extract fluid at both the top and bottom of the stack. The fluid may be received and extracted as a liquid, a gas or received as a liquid undergo a state change and be extracted as a gas. The micro-channels are suitably only formed on the backside of the RFIC chip.

In an embodiment, the RFIC chip is a Silicon material system and the MMIC Power Amplifier chip is a III-V material system, typically GaN.

In an embodiment, the circuit sides of the RFIC chip and MMIC Power Amplifier chips are bonded together.

In an embodiment, the MIMIC Power Amplifier chip comprises in-plane transmission lines that transfer power to the antenna elements, which are suitably end-fire antenna elements.

In an embodiment, an AESA includes a frame, one or more PCBs attached to the frame to fan out DC bias and LO and IF signals, an array core block positioned in the frame and electrically coupled to the one or more PCBs, and top and bottom manifolds configured to bring fluid to the array core block and circulate the fluid through the micro-channels and through substrate via holes to cool the RFIC and MMIC Power Amplifier chips and to extract heated fluid from the array core block.

In an embodiment, a plurality of array core blocks are fabricated in a multi-wafer stack using a wafer-scale direct bond interconnect process. The multi-wafer stack is diced to yield the individual array core blocks.

In an embodiment, the RFIC and MMIC Power Amplifier wafers are formed from Si and III-V based material systems at respective Silicon and III-V foundries and transferred to an integrating foundry. At the integrating foundry, the wafers are thinned to the requisite thickness for the operating frequency and fabricated to form through substrate metal vias and cooling holes through the waters and micro-channels on the backside of the RFIC wafers. The wafers are aligned and alternated to form a stack. The stack is directed bonded using a DBH process to form both hydrogen and metal to metal bonds between the wafers. The stack is bumped to provide an interface for attaching the PCBs and then diced to yield the plurality of array core blocks.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a design and method of fabrication for an array core block for an AESA that supports larger M×N array sizes and higher power RF beams. To achieve higher RF power, MMIC Power Amplifiers formed from a III-V materials system, typically GaN, must be integrated with the Si RFICs. These higher power MMIC Power Amplifiers generate more waste heat than their Silicon counterparts. Traditional techniques of only pulling heat out of one side of the array through a heatsink are insufficient.

The present invention provides an array core block for an AESA in which a stack of 2*M alternating N-channel RFIC and MMIC Power Amplifier wafers are bonded together by a wafer-scale direct bond interconnect process such as (Direct Bond Interconnect) DBI® or DBH. This process forms both mechanical and hydrogen bonds to seal the wafer stack. Each array core block includes an array of through substrate metal vias that extend vertically through the stack to distribute a DC bias to the MMIC Power Amplifier chips and LO and information signals to the RFIC chips and to connect the RFIC chips to the MMIC Power Amplifier chips. Each array core block also includes a cooling system including micro-channels formed on a backside of at least one of the chips in each bonded pair and through substrate via holes formed through the stack that operatively couple the micro-channels for all of the bonded pairs to receive and circulate a fluid through the micro-channels and through substrate via holes to cool the RFIC and MIMIC Power Amplifier chips and to extract the heated fluid.

Figure 1:
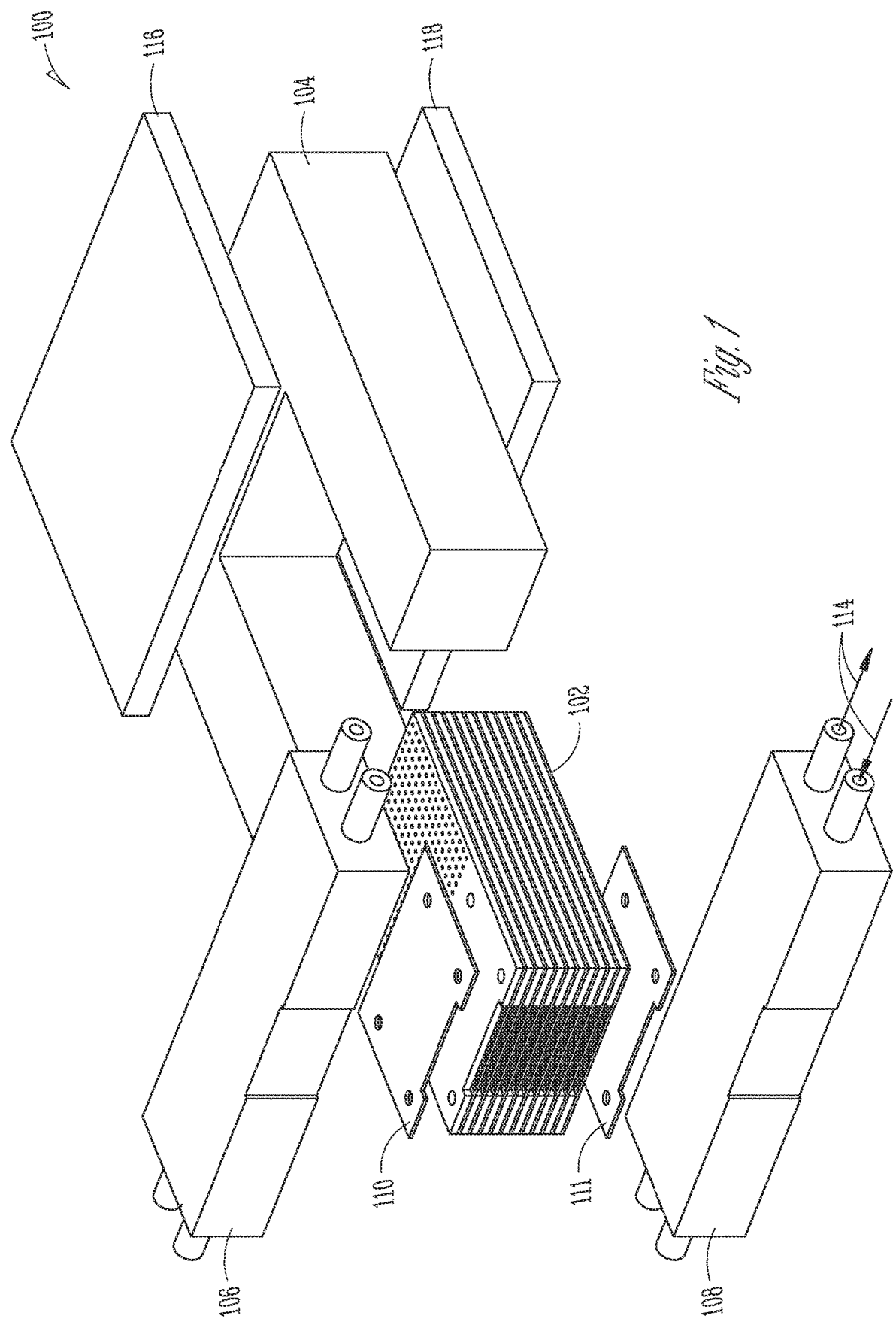
FIGS. 1 and 2 are exploded and assembled views of an embodiment of an AESA including a waver-level DBH bonded array core block.
Figure 2:
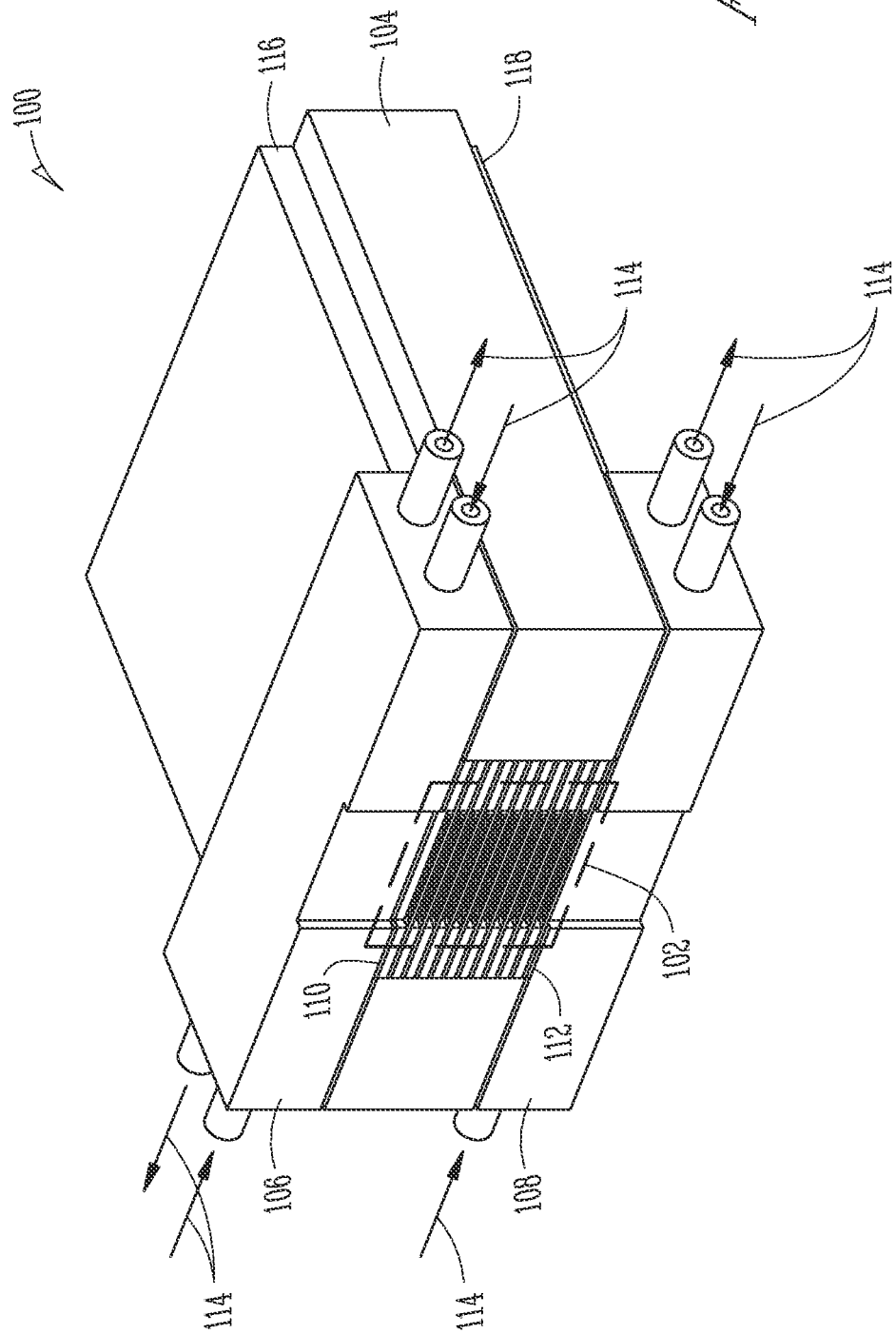
Figure 3:
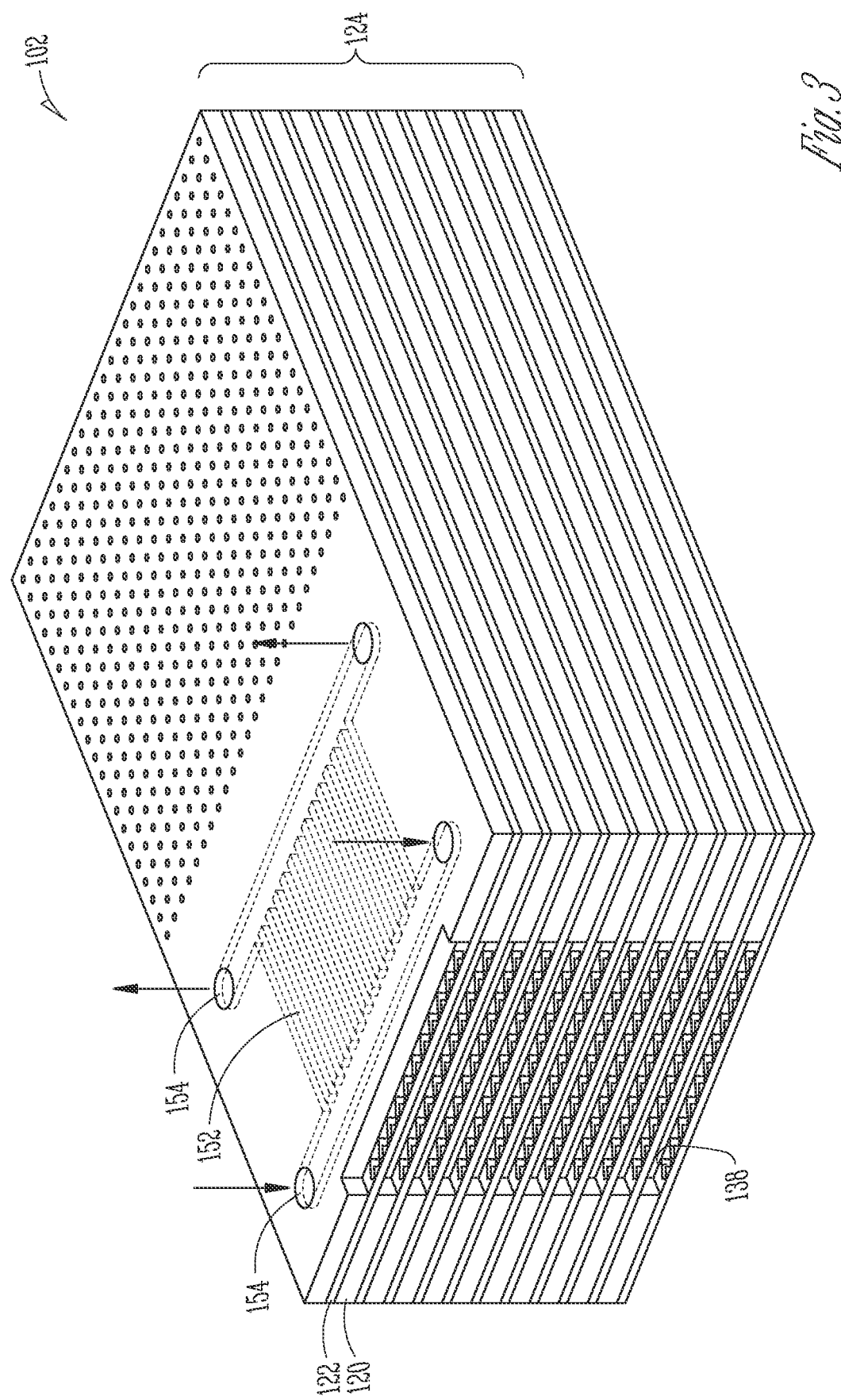
FIG. 3 is a perspective view of an array core block.
Figure 4:
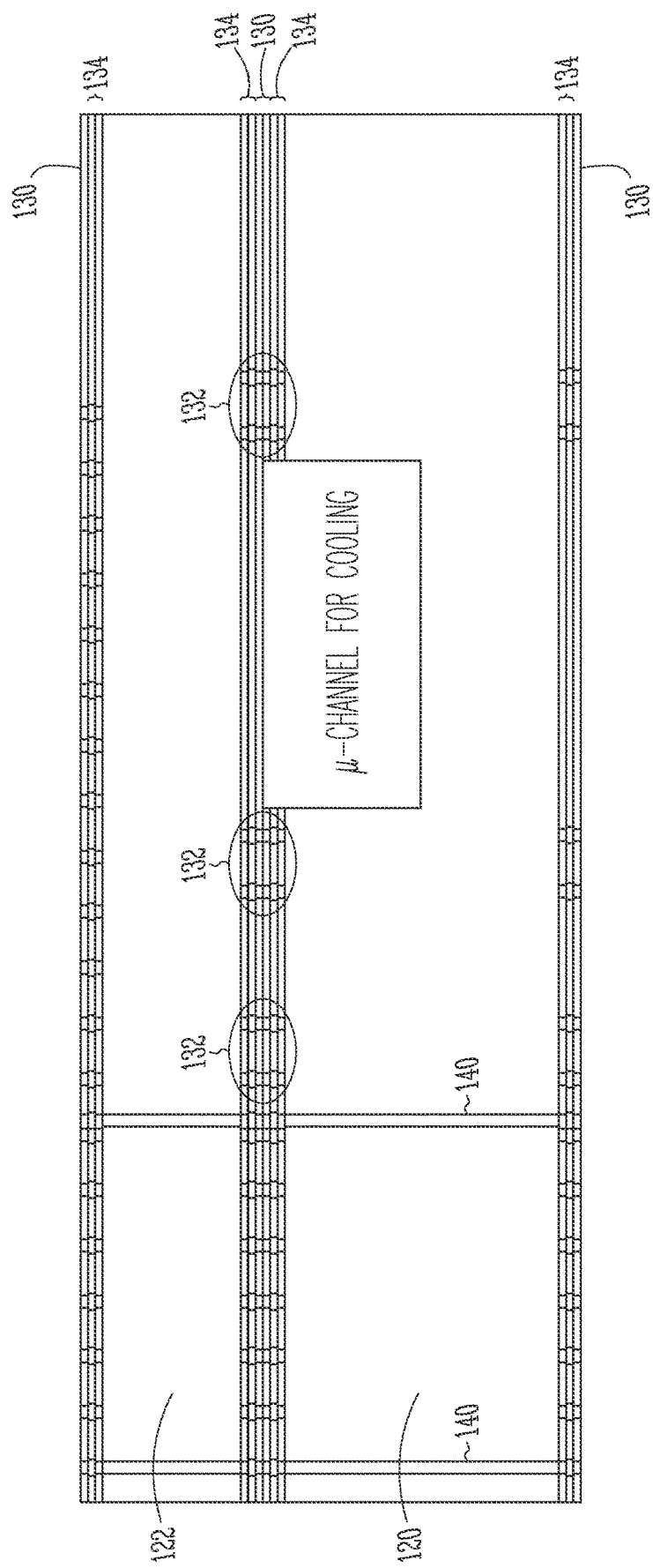
FIG. 4 is a side view of the array core block illustrating the hydrogen and mechanical bonds and the array of through substrate metal vias.
Figure 5:
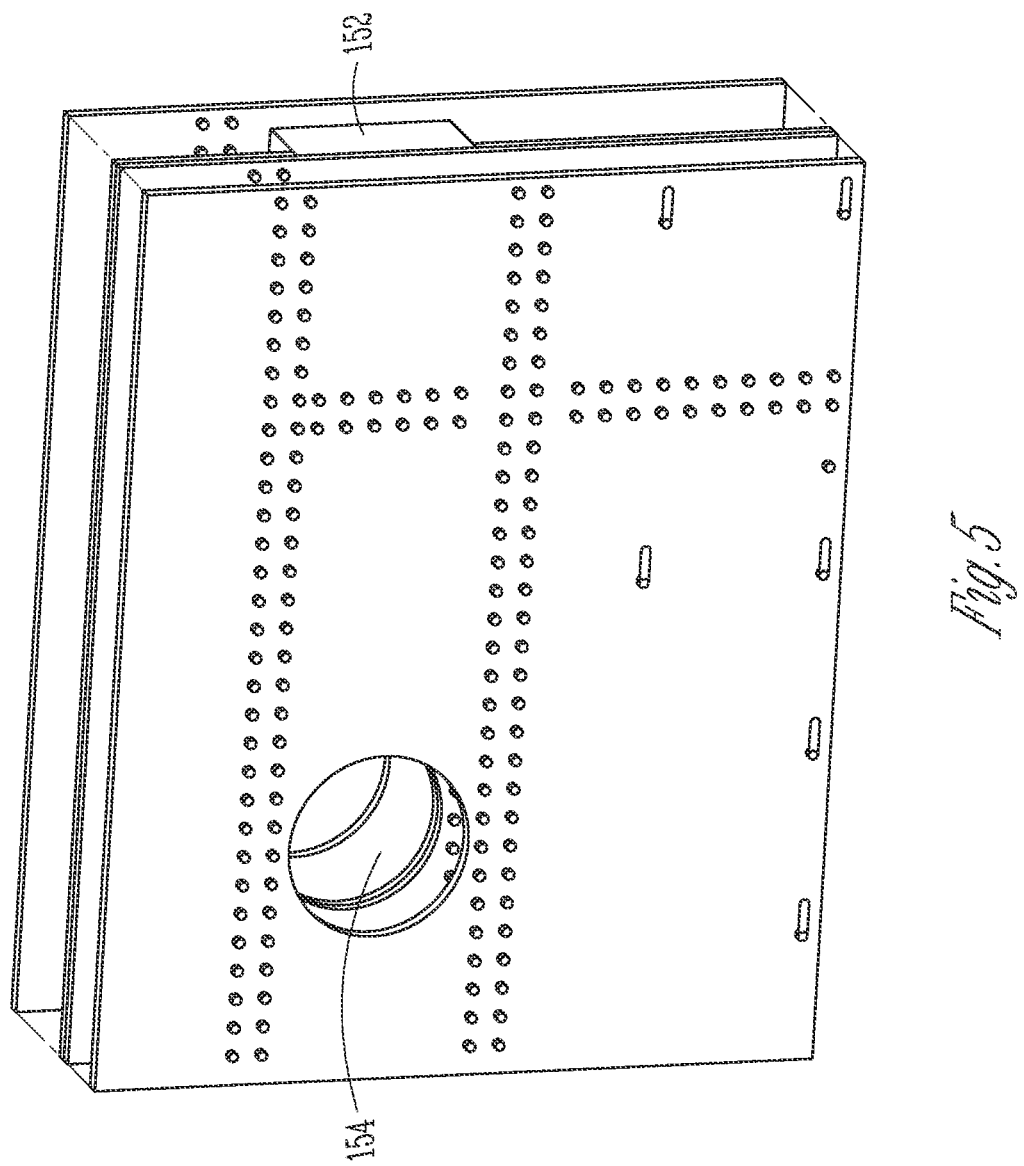
FIG. 5 is a top view of the array core block illustrating the micro-channels and through substrate cooling holes.

Referring now to FIGS. 1 and 2, an embodiment of an AESA 100 includes an Array Core Block 102 positioned in an outer frame 104 such as machined out of a lightweight metal. Top and bottom liquid manifolds 106 and 108 are mounted on frame 104 and operatively coupled with a leak tight seal to the top and bottom of Array Core Block 102 via seals 110 and 112, suitably an elastomer material, to recirculate a fluid 114 through the Array Core Block 102 to cool the RFIC and MMIC Power Amplifier chips. A pair of printed circuit boards 116 and 118 are suitably mounted on frame 104 and electrically coupled to the Array Core Block 102 via, for example, a Flip Chip Ball Grid Array to act as an electronic interface between the Array Core Block and external bias supplies, external LO and information signal generators, and an external system controller.

Referring now to FIGS. 3, 4, 5 and 6, Array Core Block 102 includes M SiGe or CMOS (Si) RF Integrated Circuit (MC) chips 120 and M III-V (e.g., GaN) Monolithically Integrated Millimeter-wave Circuits (MMIC) Power Amplifier chips 122 (and top and bottom cover wafers) that are bonded together in an alternating stack 124 using a wafer-scale direct bond process such as DBI® or DBH. The water-scale direct bond interconnect process forms both a hydrogen bond 126 and mechanical bond 128 between the wafers. These bonds form a strong mechanical connection and a leak-tight seal through the stack to contain the circulating fluid. As used herein, a Direct Bond Hybridization (DBH) process forms a hydrogen bond between opposing $SiO_2$ bonding dielectric layers 130 and a diffused metal bond between opposing metal plugs 132 in interconnect dielectric layers 134.

Each bonded pair 136 of an RFIC and a MMIC Power Amplifier chip forms an N×1 element linear sub-array that contains N antennas 138, suitably end-fire antennas, spaced at half wavelength intervals of the operating frequency. In a preferred embodiment, the thickness of each bonded pair 136 also equals a half wavelength to enable side-lobe free beam steering of +/−60 deg in both Azimuth and Elevation. The stack of M N×1 sub-arrays plus top and bottom cover wafers forms the M×N element Array Core Block.

An array of through substrate metal filled vias 140 extends vertically through the entire chip stack 124 and provides an interface to distribute a DC bias to the MMIC Power Amplifier chips, LO and information signals to the RFIC chips and digital communication controls to both chips and to connect the N output channels of the RFIC chip to drive corresponding input channels of the MIMIC Power Amplifier chip. The LO and information signals are preferably distributed throughout the stack frequencies less than 10% of the operating frequency to eliminate insertion loss issues that are associated with distribution of very high frequency signals. These signals are up-converted to the operating frequency by the RFIC on each N×1 subarray pair.

A cooling system 150 includes micro-channels 152 formed on a backside of at least one of the chips in each bonded pair and through substrate via holes 154 formed through the stack that operatively couple the micro-channels for all of the bonded pairs to receive and circulate fluid 115 through the micro-channels and through substrate via holes to cool the RFIC and MMIC Power Amplifier chips and to extract the heated fluid. In a preferred embodiment, the fluid is injected and extracted at both the top and bottom of the stack. The system may be a forced liquid or gas cooling system. For higher power dissipation, a forced liquid dual phase approach in which liquid is injected into the array core block, heated to undergo a phase change to a gas state and removed is preferred. The wafer-scale direct bond processes provide a high quality seal due to the planarity of the direct bond process and the high strength hydrogen and mechanical bonds.

Figure 6:
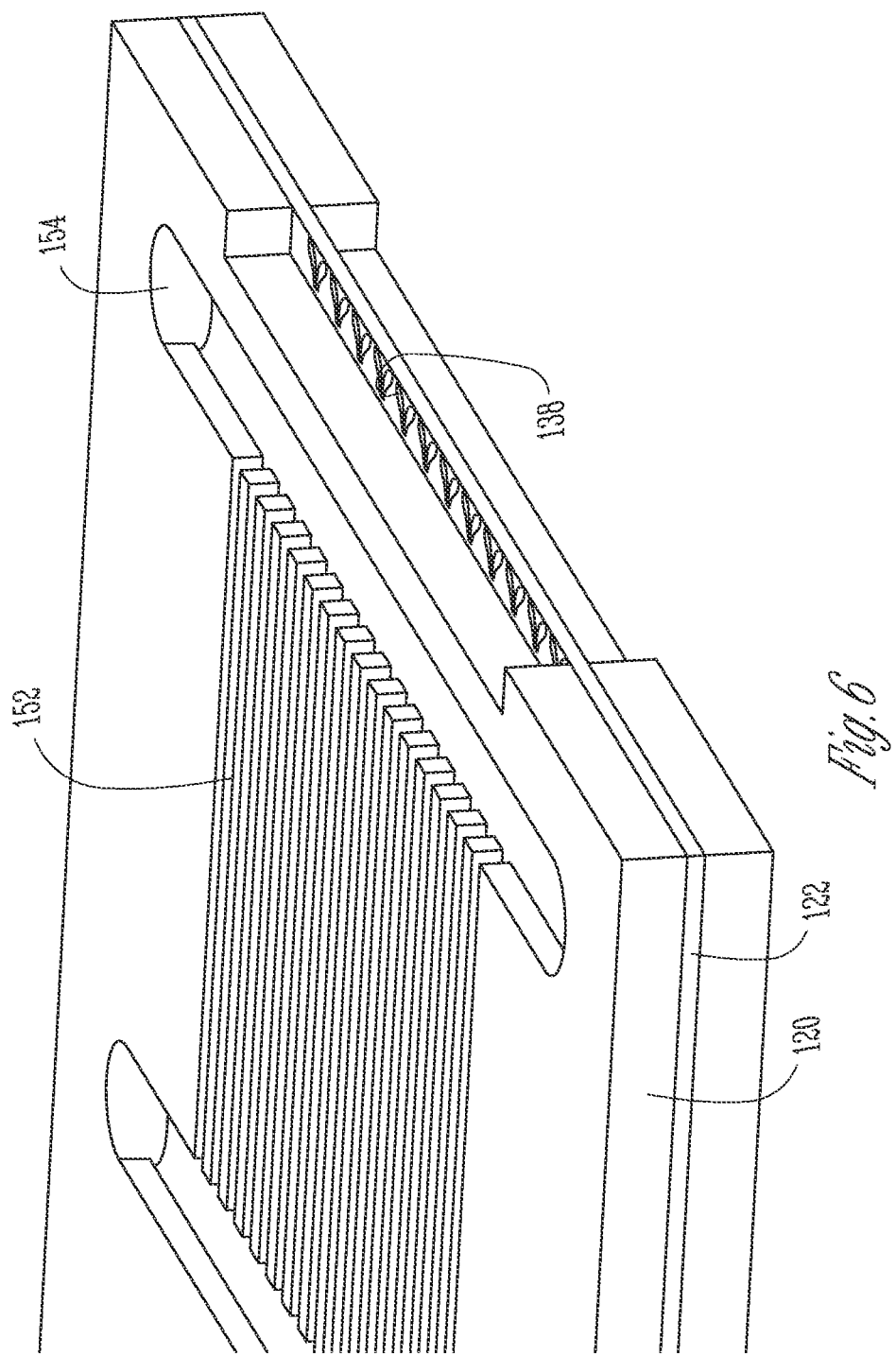
FIG. 6 is a view of a MMIC Power Amp chip bonded between RFIC chips in the array core block.
Figure 7:
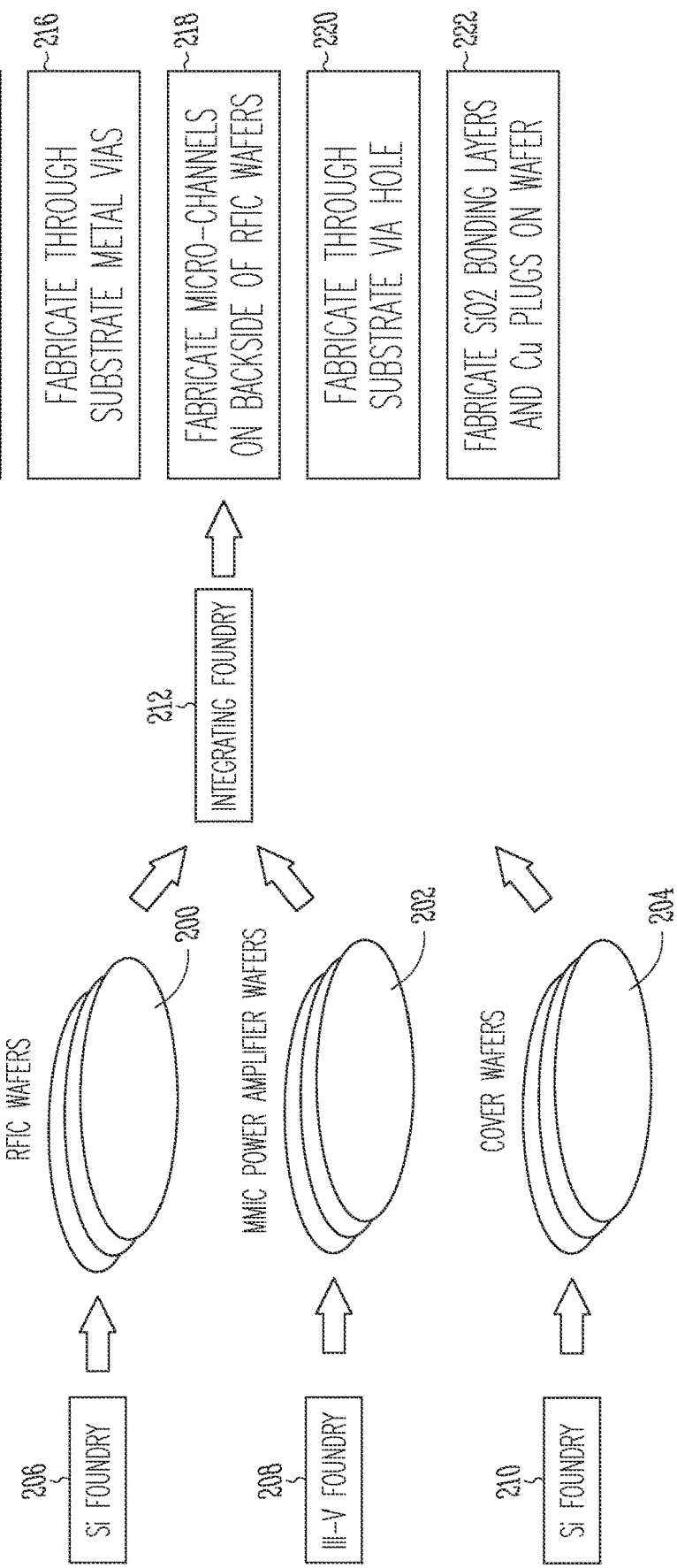
FIG. 7 is a flow diagram of a portion of the fabrication process to prepare the RFIC and MMIC Power Amplifiers for the direct bonding processing.

In the preferred embodiment circuit sides of (Si/RFICs) are bonded to circuit sides of (GaN MMICs) and backsides of (Si/RFICs) are bonded to back sides of (GaN MMICs) as shown in FIG. 6. This bonding configuration is preferred to minimize transition loss between two chips at operating frequencies above 50 GHz, because it ensures the shortest interconnect distance between two chips. This configuration is also preferred, because it provides more options for design of compact matching networks and bias distribution networks on GaN MMIC by utilizing more numerous (7 or more) and dense metal interconnect layers on Si/RFIC wafer in addition to metal interconnect layers available on GaN/MMIC wafer (typically 2 to 3).

As shown in FIG. 6, high efficiency end-fire antennas 138 are realized in top metallization layers of the GaN MMIC chip 122 and micro-channels 152 are etched into the backside of Si/MC chip 120. The end-fire antennas are integrated on the GaN chip to minimize insertion loss between the output of GaN power amplifier and antenna by eliminating vertical transitions between chips. In-plane transmission lines transfer power from the power amplifier channels to the respective end-fire antennas. The GaN chip is also made thinner than Si/RFIC chip to improve radiating efficiency of the end-fire antenna. The micro-channels are etched into Si/RFIC chip, because it is thicker. The bonding interfaces on both sides of the chips include SiO2 bonding layers 130 and a Cu-plug array 132 that are fabricated by Cu Damascene process. Cu-plug arrays serve two purposes: provide electrical connection between chips and provide strong metal-to-metal mechanical bond between chips after post bond anneal step.

Referring now to FIGS. 7, 8A-8C, 9A-9B and 10, an exemplary process for Array Core Block fabrication is illustrated for a 12×12 element array for a 220 GHz operating frequency. Si/RFIC wafers 200, GaN/MMIC wafers 202 and top and bottom cover wafers 204 are fabricated in their respective foundry fabrication processes 206, 208 and 210. These foundry processes have to support Cu Damascene multilayer metal interconnects to achieve wafer planarity and interface for a DBH bonding process. The state of the art Si/RFIC processes support more than 7 metal interconnect layers, while GaN/MMIC processes typically support only two to three. In a preferred process flow the same wafer diameter and the same reticle size is used for both sets of wafers, and the preferred wafer diameter is 200 mm or more for compatibility with the state of the art back of the line Si processing tools. The reticle size is chosen to accommodate an entire 1×N element chip. The max reticle size is dictated by the maximum field size of photolithography stepper. As an example, 26 mm×33 mm is a maximum field size of a current state of the art i193 EUV stepper.

After the completion of front side processing in a respective foundry, the wafers are sent to an integration foundry 212, where Si/RFIC and GaN/MMIC wafers are thinned to the required thickness 214, and have through substrate metal vias 216, micro-channels for dual phase cooling 218 and through substrate via holes 220 for cooling medium distribution fabricated into them using standard back of the line semiconductor fabrication techniques. The integration foundry also fabricates DBH bonding interfaces 222, 5102 layers and Cu-plug arrays, on both sides of the wafers using the Cu Damascene process.

Figure 8A:
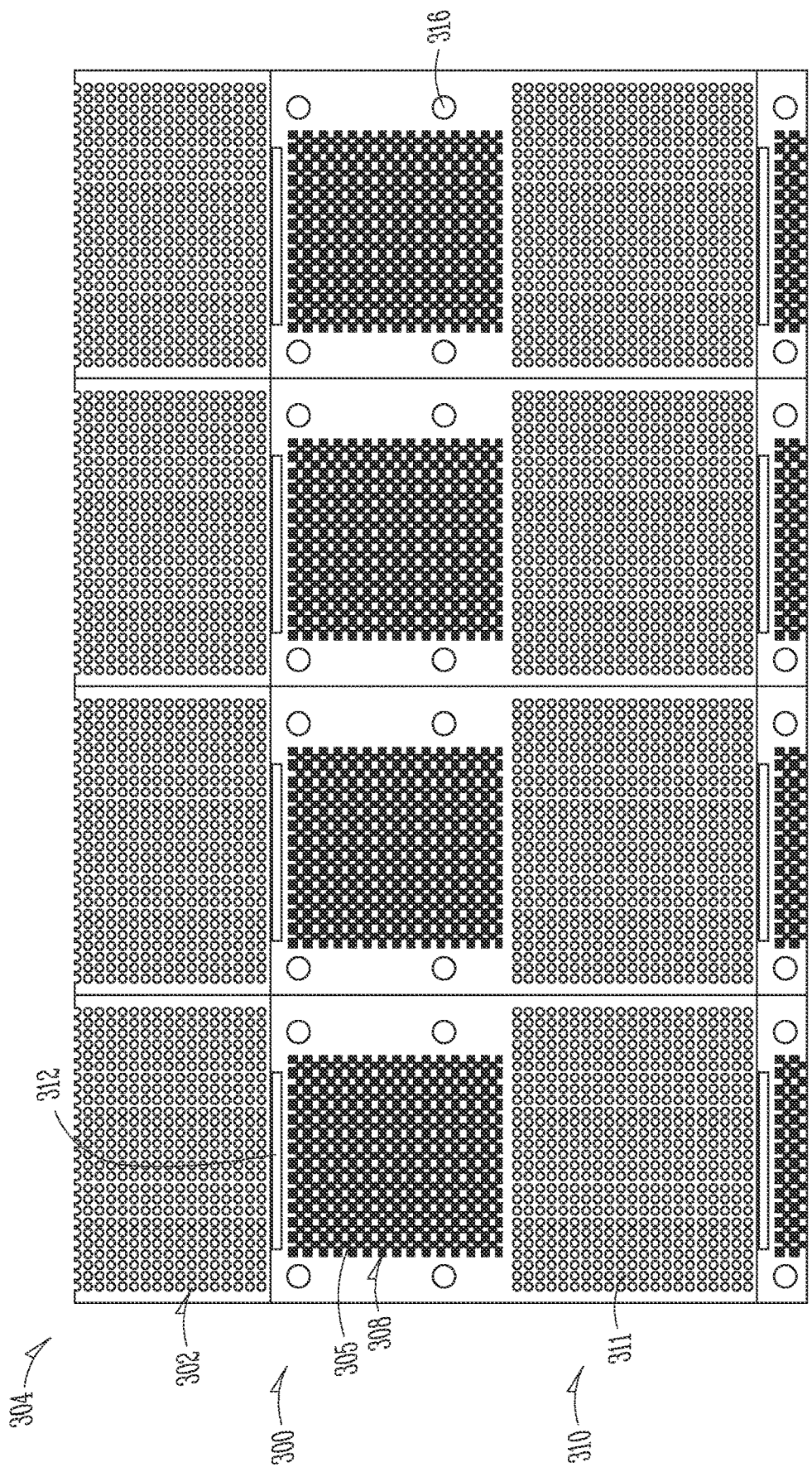
FIGS. 8A through 8C are views of the circuit and back sides of the RFIC wafer and the circuit side of the MMIC Power Amp wafer.
Figure 8B:
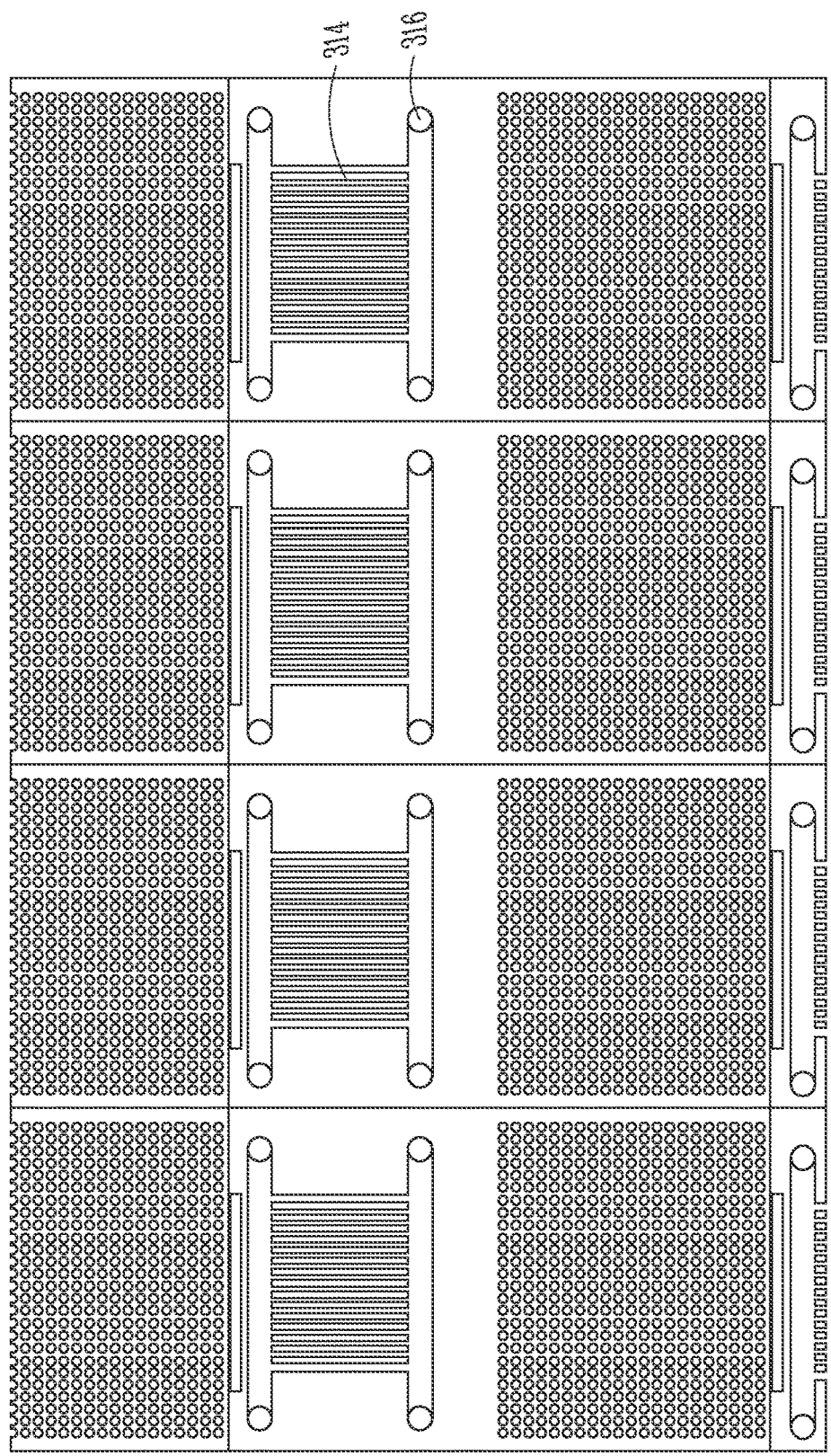
Figure 8C:
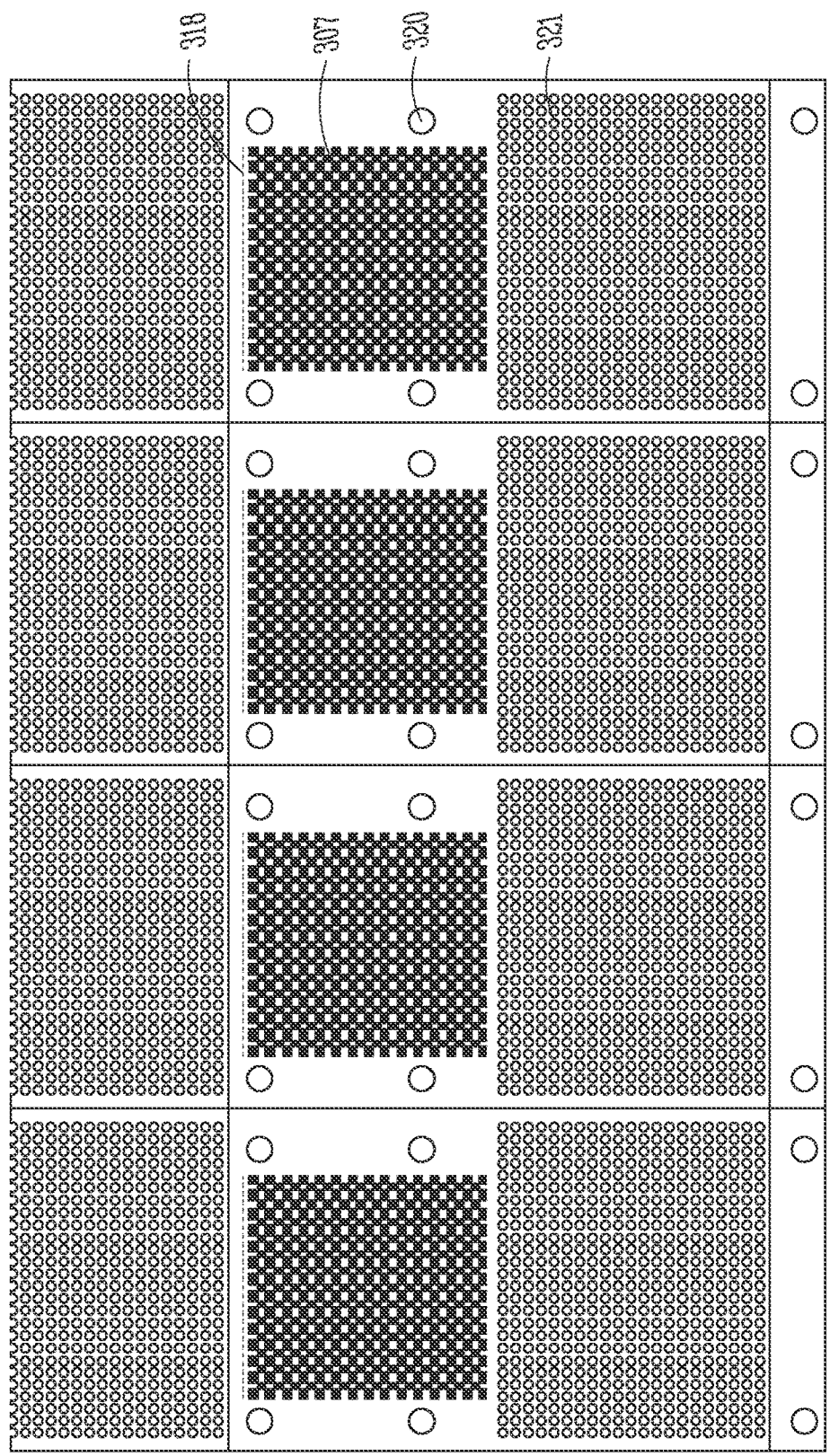

FIG. 8A-8C shows details of four full reticles 300 and eight partial reticles 302 on a Si/RFIC wafer 304 and a corresponding GaN/MMIC wafer 306 as they are prepared for wafer-scale DBH bonding step. Dimensions for the example 1×12 element 220 GHz reticle are 16.2 mm×24.4 mm. FIG. 8A shows the circuit side of the RFIC wafer with Si circuitry 305, FIG. 8B shows the backside of the RFIC wafer and FIG. 8C shows the circuit side of the MMIC Power Amplifier wafer with GaN circuitry 307.

In the example reticle layout, a 10 mm×12 area 308 of the reticle is dedicated for circuitry on both wafers, and a 12 mm×15 mm area 310 of the reticle is dedicated for dual side pad/(through substrate metal via) array 311 that is used for bias routing, LO, IF and system clock distribution and digital communication interface between 12×1 element subarray pairs. The metal interconnect layers on both wafers of 1×12 element subarray pair are used to provide interface circuitry on each chip with the appropriate pad of the through substrate via array.

Other features of the Si/RFIC reticle, shown in FIGS. 8A-8B are: a dry etched through slot opening 312 for the end-fire antenna elements, a micro-channel manifold 314 for cooling fabricated by deep partial thy etch into the backside of the wafer and dry etched through via holes 316 for coolant distribution.

Other features of the GaN/MIMIC wafer shown in FIG. 8c are: end-fire antenna elements 318, dry etched through via holes 320 for coolant distribution and a pad array 321 for Bias, LO and information signal distribution. These features on the GaN/MMIC wafer, along with dual side pad/(through substrate via) array are designed to align with corresponding features on the Si/RFIC wafers and the cover wafers during the DBH wafer bonding process.

Figure 9A:
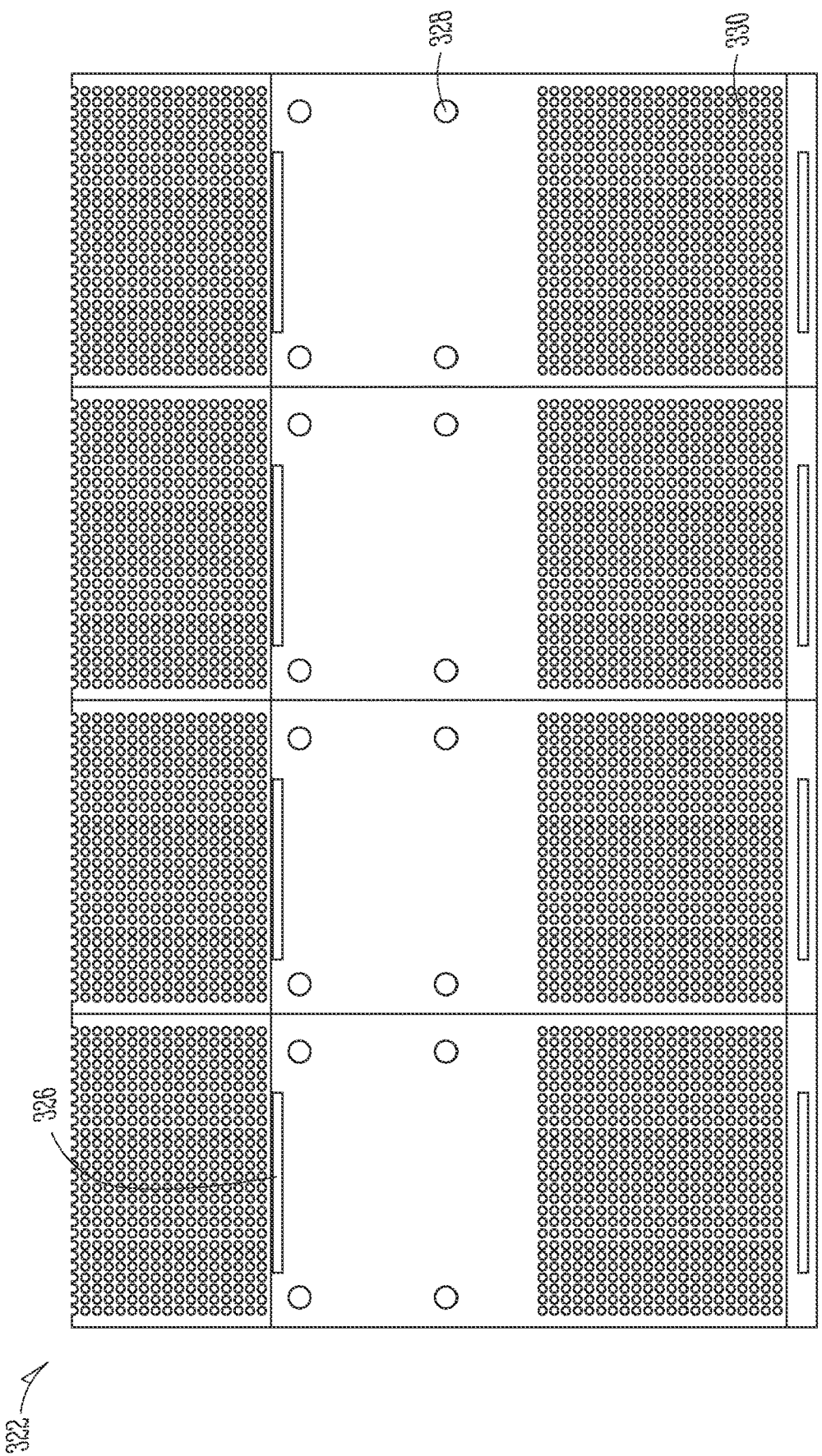
FIGS. 9A and 9B of the micro-channel and blank sides of cover wafers for the stack.
Figure 9B:
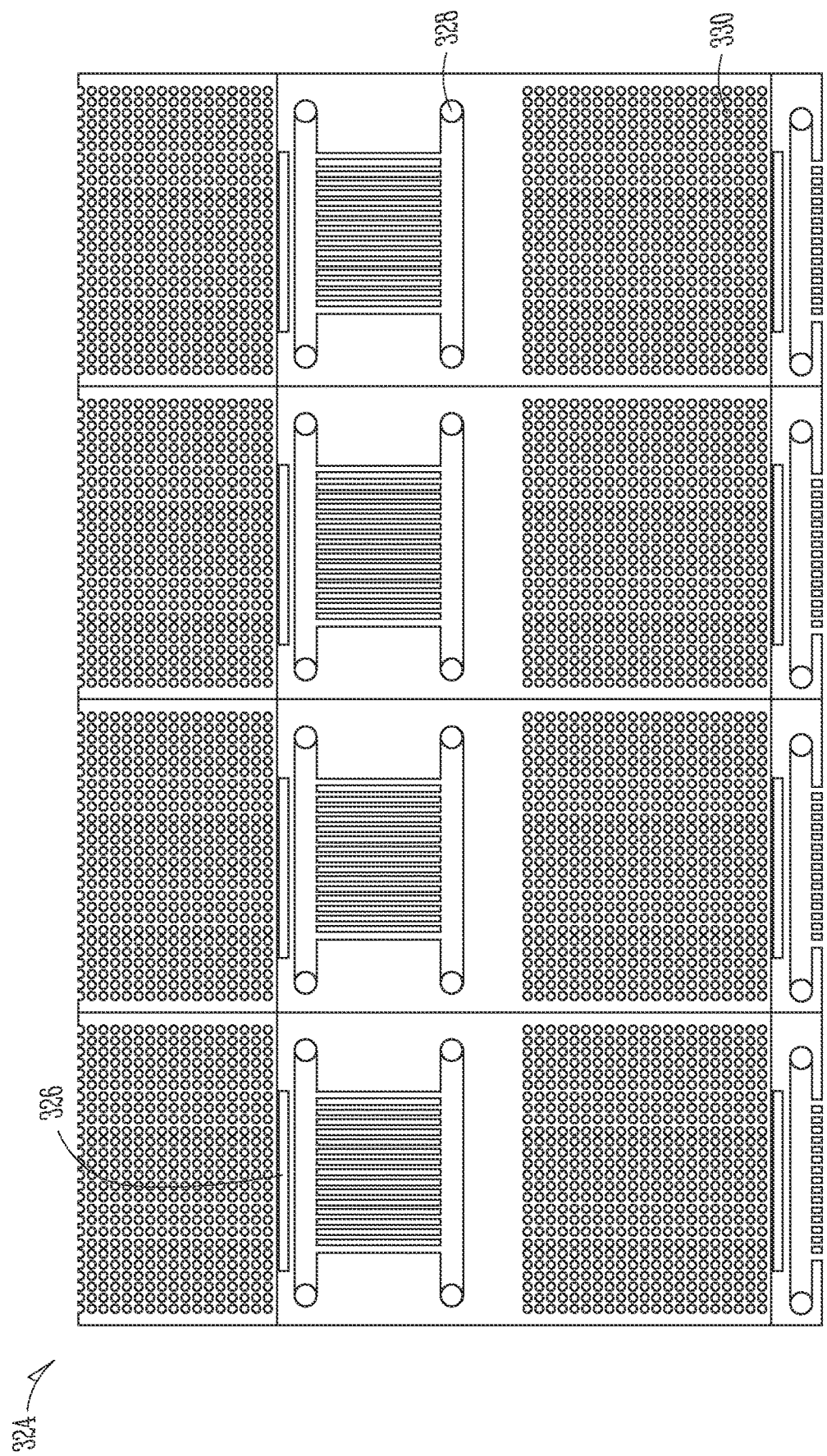

FIGS. 9A-9B illustrate top (blank side) and bottom (micro-channel side) cover wafers 322 and 324, respectively. Features of the cover wafers are: a dry etched through slot opening 326 for the end-fire antenna elements, dry etched through via holes 328 for coolant distribution, and a dual side pad/(through substrate via) array 330. These features on the cover wafers are designed to align with corresponding features on the Si/RFIC and GaN MMIC wafers. Cover wafers contain no active circuitry. The bottom and top cover wafers differ in that, that the bottom cover wafer has micro-channels for liquid cooling etched into its back side, while top cover wafer does not have micro-channels.

Figure 10:
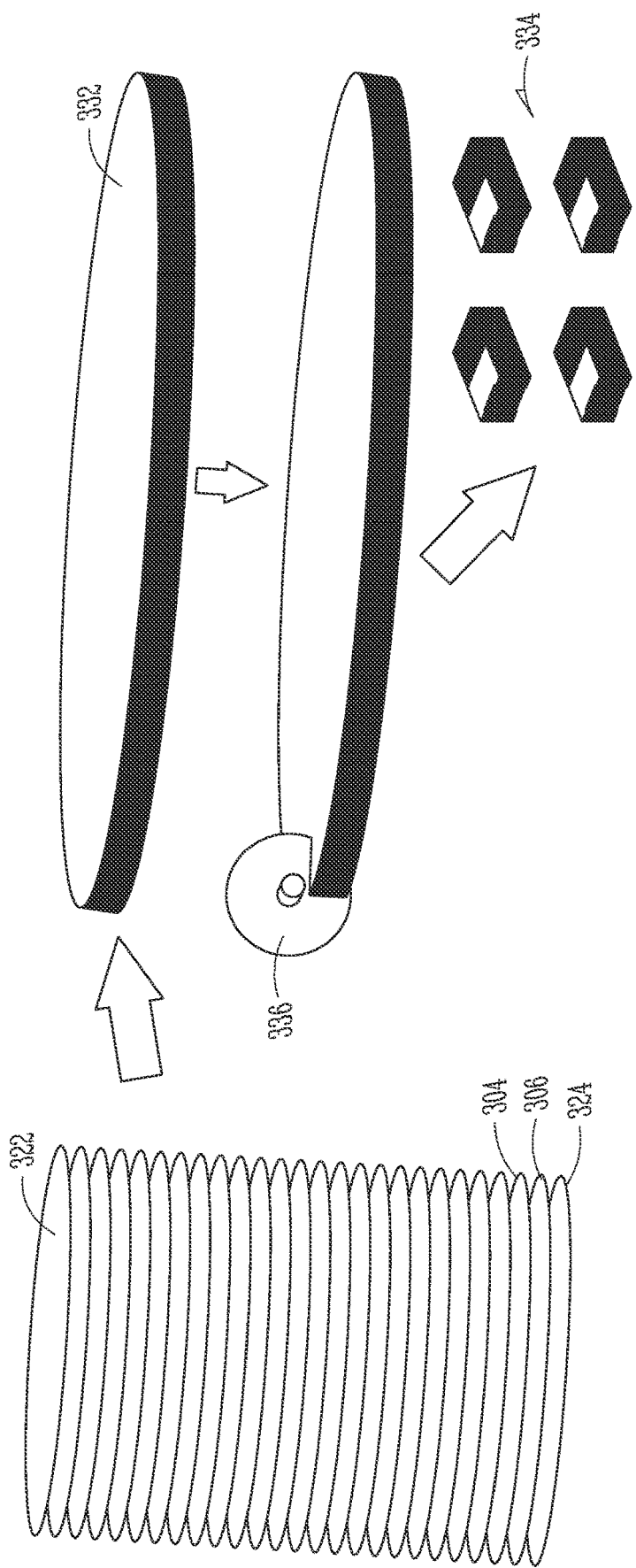
FIG. 10 illustrates a wafer-level RFIC process to fabricate multiple array core blocks.

Waters that are prepared for a water level DBH bonding step are bonded into multi-wafer stack in a sequence outlined in FIG. 10. The micro-channel side of the bottom cover wafer 324, position 1, is bonded to the backside of GaN/MMIC wafer 306 in position 2, which is bonded to a circuit side of Si/RFIC wafer 304 in position 3. The bonding sequence of GaN/MMIC and Si/RFIC wafers is than repeated eleven more times. The wafer stack is completed by bonding top cover wafer 322 to the micro-channel side of Si/RFIC wafer 304 in position 25. Completion of the DBH bonding process yields a full multi-wafer stack 332. Details on DBH interconnect process can be found in "Sub-10 μm Pitch Hybrid Direct Bond Interconnect Development for Die-to-Die Hybridization", by John P. Mudrick et al., 2019 IEEE 69th Electronic Components and Technology Conference (ECTC), and in references therein, and in U.S. Pat. No. 6,962,835 and in references therein. Thereafter, solder bumps are deposited onto corresponding pads on both sides of the multi-wafer stack 332, and the wafer stack is then diced along cut lines into individual Array Core Blocks 334 using a saw 336. A single 200 mmm diameter multi-wafer stack fabricated by the described process can yield more than 60 200 GHz 12×12 Element Array Core Blocks.

The lower frequency limit of the proposed Array Core Block architecture is dictated by maximum water thickness. Standard thicknesses of 200 mm and 300 mm Si wafers are 725 μm and 775 μm, respectively. The total thickness of two stacked non-thinned Si wafers that contain all metallization and bonding layers is estimated to be in 1.5 mm to 1.7 mm range, which corresponds to a half wavelength spacing at frequencies in 88 GHz to 100 GHz range. A maximum wafer thickness may support frequencies of 50 GHz or higher.

The upper frequency limit of the proposed architecture is dictated by two factors. The first is the minimum thickness to which wafers can be thinned and practically handled. Currently a safe estimate for minimum thickness of thinned wafers that contain all metallization and bonding layers is in 60 μm to 100 μm range, which puts the upper frequency limit into 750 GHz to 1250 GHz range.

The second factor is a reduced cross section of micro-channels for forced convection cooling at reduced wafer thicknesses. The reduction of micro-channel cross-section impedes coolant flow rate and heat exchange. 500 μm is an estimated minimum thickness of a two wafer stack that can support forced dual phase cooling, which puts the upper frequency limit for most heat intensive applications to 300 GHz. The frequency range can be extended up to 750 GHz to 1250 GHz range for heat loads that can be handled by forced liquid cooling or gas flow micro-channel cooling.

Figure 11:
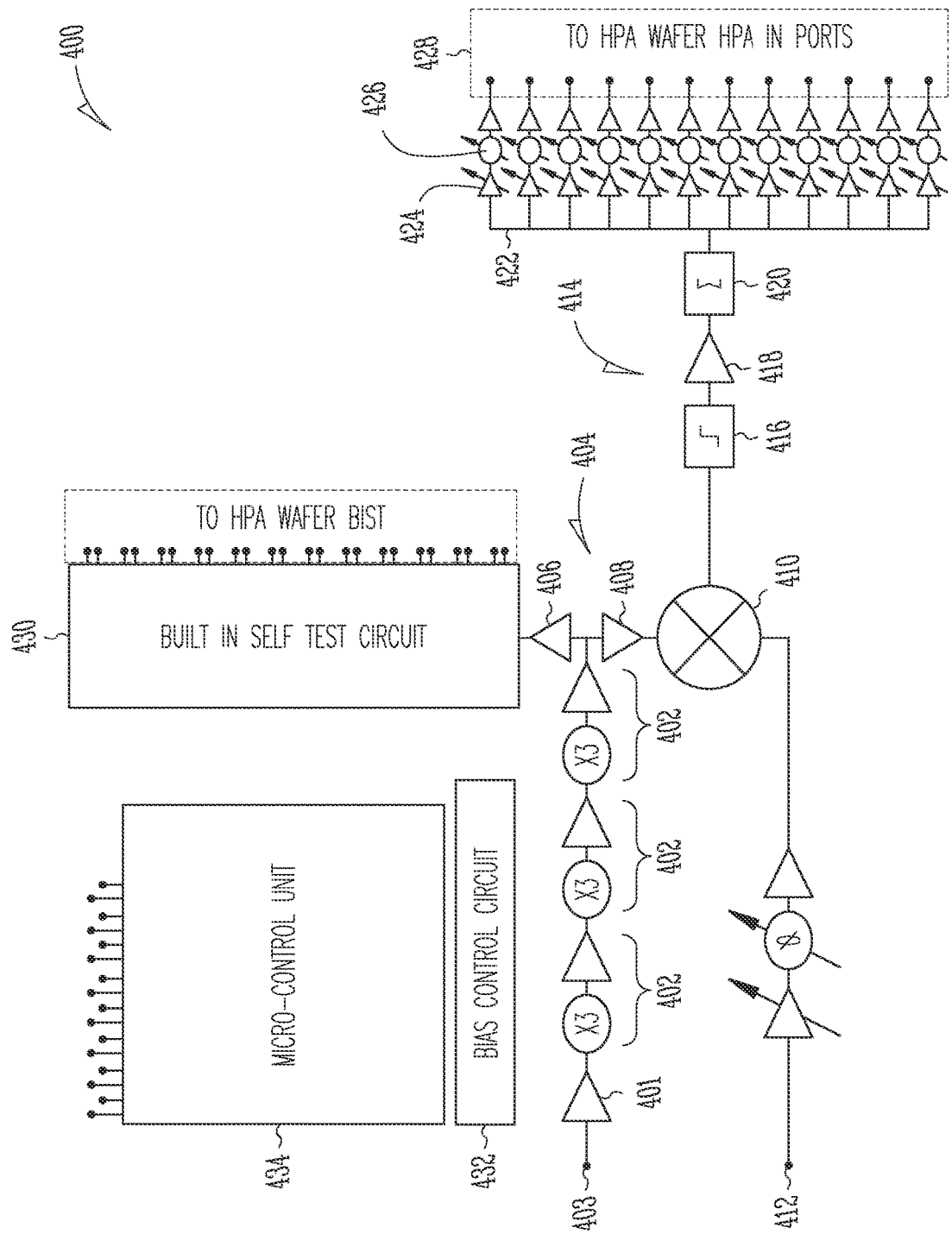
FIG. 11 is a schematic diagram of an FIC chip or unit cell on the RFIC wafer.
Figure 12:
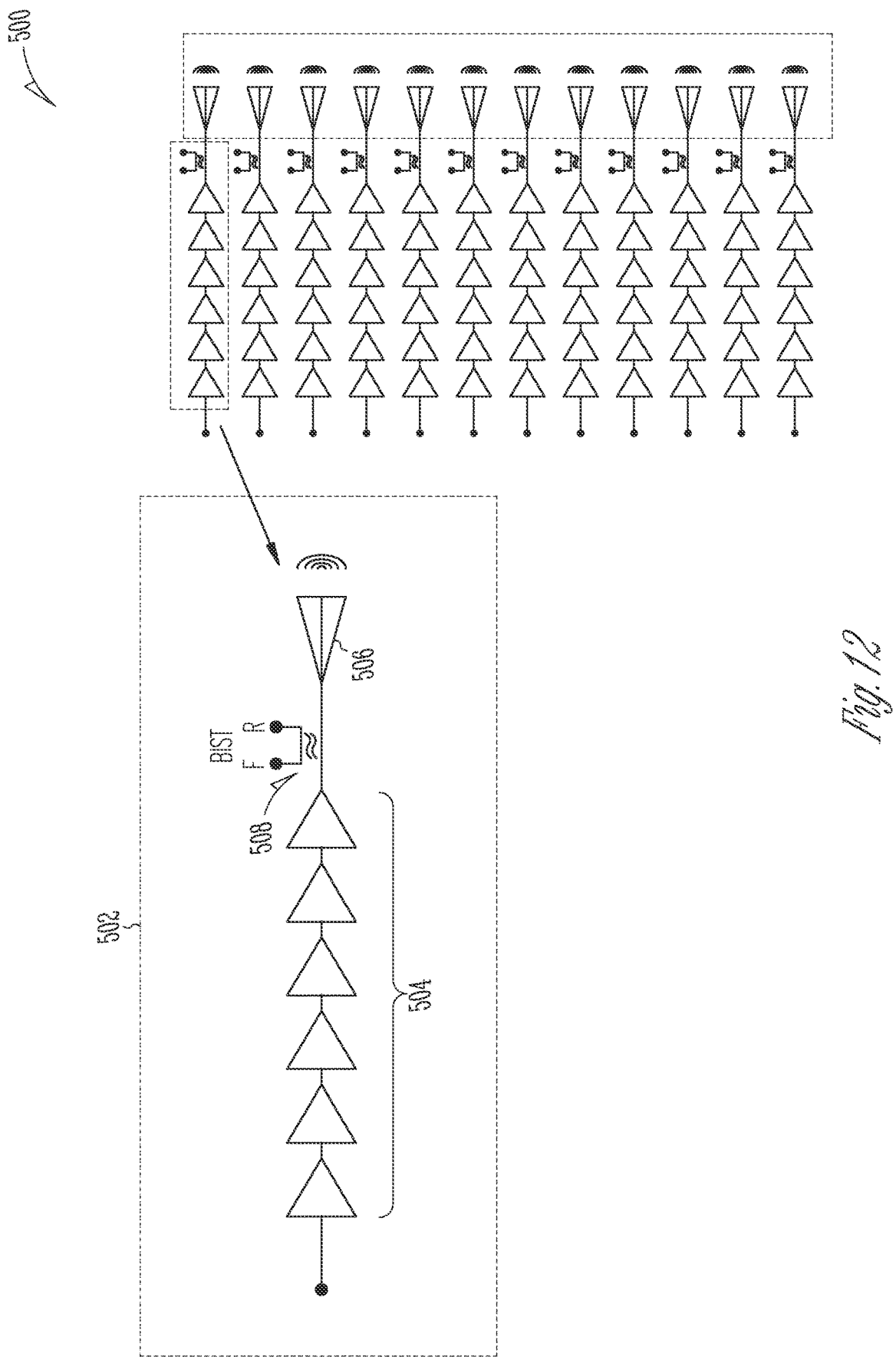
FIG. 12 is a schematic diagram of a MMIC Power Amp chip or unit cell on the MMIC wafer.

Referring now to FIGS. 11 and 12, schematic diagrams of a 12×1 unit cell circuitry on a Si/RFIC wafer and a 12-channel unit cell circuitry on a GaN/MMIC Power Amplifier wafer are shown for a 12×12 element 220 GHz Array Core Block.

Referring to FIG. 11, a Si/RFIC chip 400 includes an amplifier 401 and three amplify up-conversion stages 402, each of which up-converts the signal by a factor of three, to up-convert a 8.13 GHz LO signal 403 to 219.5 GHz. The 219.5 GHz LO signal is split into two paths via splitter 404 and amplified by amplifiers 406 and 408. One path feeds an up-conversion mixer 410, which mixes the upconverted 219.5 GHz LO with a 0.5 GHz-5.5 GHz information signal 412 to generate 220 GHz-225 GHz RF signal 414, The RF signal is high-pass filtered 416, amplified 418 and split into 12 paths by a 12-way RF beamforming network 420 that includes a power splitter 422, variable gain amplifiers 424 and phase shifters 426. The beamforming network also amplifies 428 the RF signal to a power level that is needed to drive the GaN MMIC high power amplifiers (HPAs). The output of each RF path on the Si/RFIC is connected to the input of a corresponding HPA on GaN MMIC chip.

The second path of 219.5 GHz LO signal feeds built-in-self-test (MST) circuit 430, which is used for array self-calibration and test. The BIST circuit monitors amplitude and phase of forward transmitted and reflected RF signals at the output of each GaN MMIC power amplifier through an array of 24 RF ports that are connected to corresponding directional coupler ports on GaN/MMIC chip. These ports can also be used to monitor the coupled amplitude and phase of adjacent antenna elements by turning off the bias to the corresponding GaN MMIC HPA. The Si RFIC chip also contains a bias control circuit 432, which controls biasing of individual active components on the 12×1 element subarray, and a microcontroller unit (MCU) 434 that is used to monitor and control operation of the 12×1 element subarray, to perform array self-calibration and for interface with other subarrays and external system controller.

Referring to FIG. 12, a Ga/MMIC chip 500 includes 12 identical HPAs 502 that run in parallel. The HPAs are suitably designed to be narrower than half wavelength spacing at the operating RF frequency, and contain sufficient number of RF amplification stages 504 to saturate the output stage when the maximum power that can be provided by Si/RFIC is delivered to the HPA input. An advantage of proposed array architecture is that it eliminates half-wavelength dimension requirement for the length of the HPA chip. Each HPA contains End-Fire Antenna 506 and a directional coupler 508 that is connected to input ports of BIST circuit on Si/RFIC.

In addition to the Transmit only array configuration outlined above, other array configurations, such as transmit/receive can be implemented in proposed architecture.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. An array core block for an Active Electronically Steerable Array (AESA) for operating frequencies above 50 GHz, said array core block comprising:
   a stack of 2*M alternating N-channel RFIC and MMIC Power Amplifier chips bonded together by a wafer-scale direct bond interconnect process to form M bonded pairs of an M×N element array core block;
   an array of through substrate metal vias that extend vertically through the stack to (a) distribute a DC bias to the MMIC Power Amplifier chips and local oscillator (LO) and information signals to the chips and (b) connect the N output channels of the RFIC chip to drive corresponding input channels of the MIMIC Power Amplifier chip to drive respective antenna elements integrated on the MIMIC Power Amplifier such that the M×N element array core block forms a steerable RF beam at the operating frequency; and
   a cooling system including micro-channels formed on a backside of at least one of the chips in each bonded pair and through substrate via holes formed through the stack that operatively couple the micro-channels for all of the bonded pairs to receive and circulate a fluid through the micro-channels and through substrate via holes to cool the RFIC and MMIC Power Amplifier chips and to extract the heated fluid.

2. The array core block of claim 1, wherein the chips are bonded by a hydrogen bond between opposing $SiO_2$ bonding dielectric layers and a metal-to-metal bond between opposing metal plugs, wherein said hydrogen and metal-to-metal bonds form a seal throughout the stack to contain the circulating fluid.

3. The array core block of claim 1, wherein the LO and information signals are at frequencies less than 10% of the operating figure, wherein the RFIC chip is configured to upconvert the LO to the operating frequency.

4. The array core block of claim 1, wherein the through substrate via holes are configured to receive fluid and to extracted heated fluid at both the top and bottom of the stack.

5. The array core block of claim 1, wherein the micro-channels are only formed on the backside of the RFIC chip.

6. The array core block of claim 1, wherein the fluid is received as a liquid undergoes a phase change and is extracted as a gas.

7. The array core block of claim 1, wherein the RFIC chip is a Silicon material system and the MIMIC Power Amplifier chip is a material system.

8. The array core block of claim 1, wherein the antenna elements are spaced at and each bonded pair has a thickness of one-half the wavelength at the operating frequency.

9. The array core block of claim 1, wherein each RFIC chip and each MIMIC Power Amplifier chip have a circuit side and a backside, wherein in each bonded pair the circuit sides are facing each other to minimize the length of the through substrate metal vias that connect the RFIC chip to the MIMIC Power Amplifier chip.

10. The array core block of claim 1, wherein each MIMIC chip further comprises in-plane transmission lines that transfer power from the power amplifier channels to the antenna elements.

11. An M×N Active Electronically Steerable Array (AESA) for operating frequencies above 50 GHz, comprising:
a frame;
one or more printed circuit boards (PCBs) attached to the frame to fan out DC bias and local oscillator (LO) and information signals;
an array core block positioned in the frame and electrically coupled to the one or more PCBs, said array core block comprising,
a stack of 2*M alternating N-channel RFIC and MMIC Power Amplifier chips bonded together by a wafer-scale direct bond interconnect process to form M bonded pairs of an M×N element array core block;
an array of through substrate metal vias that extend vertically through the stack to (a) distribute a DC bias to the MMIC Power Amplifier chips and local oscillator (LO) and information signals to the RFIC chips and (b) connect the N output channels of the RFIC chip to drive corresponding input channels of the MIMIC Power Amplifier chip to drive respective antenna elements integrated on the MIMIC Power Amplifier such that the M×N element array core block forms a steerable RF beam at the operating frequency; and
a cooling system including micro-channels formed on a backside of at least one of the chips in each bonded pair and through substrate via holes formed through the stack that operatively couple the micro-channels for all of the bonded pairs; and
top and bottom manifolds configured to bring fluid to the array core block and circulate the fluid through the micro-channels and through substrate via holes to cool the MC and MMIC Power Amplifier chips and to extract heated fluid from the array core block.

12. The AESA of claim 11, wherein the chips are bonded by a hydrogen bond between opposing $SiO_2$ bonding dielectric layers and a metal-to-metal bond between opposing metal plugs, wherein said hydrogen and metal-to-metal bonds form a seal throughout the stack to contain the circulating fluid.

13. The AESA of claim 11, wherein the through substrate via holes are configured to receive fluid at both the top and bottom of the stack, said fluid undergoing a phase change to gas as it circulates through the micro-channels and the gas is extracted heated at both the top and bottom of the stack.

14. A multi-wafer stack for an Active Electronically Steerable Array (AESA) for operating frequencies above 50 GHz, said stack comprising:
a stack of 2*M alternating N-channel RFIC and MMIC Power Amplifier wafers bonded together by a wafer-scale direct bond interconnect process, said N-channel RFIC and MMIC Power Amplifier wafers including a plurality of N-channel RFIC chips and N-channel MMIC Power Amplifier chips, respectively, in vertical alignment through the stack to form M bonded pairs of the plurality of M×N element array core blocks;
each array core block comprising,
an array of metal thru vias that extend through each array core block to (a) distribute a DC bias to the MMIC Power Amp and local oscillator (LO) and information signals to the RF C and (b) connect the IF modulated and upconverted LO from each of the N output channels of the RF IC to the input of respective channels of the MIMIC power amp that amplifies the signal to form a steerable RF beam at the operating frequency; and
a cooling system for each array core block, said cooling system including micro-channels formed on the backside of the RF IC and vertical through holes that operatively couple the micro-channels for all of the bonded pairs to receive and circulate a fluid through the stack of micro-channels and vertical through holes to cool the chips and to extract the heated fluid,
wherein said stack is separable into the plurality of M×N element array core blocks.

15. The multi-wafer stack of claim 14, wherein the chips are bonded by a hydrogen bond between opposing $SiO_2$ bonding dielectric layers and a metal-to-metal bond between opposing metal plugs, wherein said hydrogen and metal-to-metal bonds form a seal throughout the stack to contain the circulating fluid.

16. The multi-wafer stack of claim 14, wherein the through substrate via holes are configured to receive fluid at both the top and bottom of the stack, said fluid undergoing a phase change to gas as it circulates through the micro-channels and the gas is extracted heated at both the top and bottom of the stack.

17. The multi-wafer stack of claim 14, wherein the RFIC chip is a Silicon material system and the MIMIC Power Amplifier chip is a material system.

18. A method of fabrication of a plurality of array core blocks for an Active Electronically Steerable Array (AESA) for operating frequencies above 50 GHz, said method comprising:

fabricating M RFIC wafers from a Silicon based material system at a Silicon foundry;

fabricating M MMIC Power Amplifier wafers from a III-V based material system at a III-V foundry;

at an integrating foundry, thinning the RFIC and MMIC wafers to specified thicknesses;

fabricating through substrate metal vias in the RFIC and MIMIC Power Amplifier wafers;

fabricating micro-channels on the backside of the RFIC wafers;

fabricating through substrate via holes in the WIC and MMIC Power Amplifier wafers;

fabricating direct bond dielectric interfaces on both sides of the RFIC and MMIC Power Amplifier wafers;

performing the wafer-scale direct bond process on alternating MIMIC Power Amplifier and RFIC wafers to form mechanical and hydrogen bonds that seal a multi-wafer stack;

bumping the multi-wafer stack to provide an interface for attachment to printed circuit boards (PCBs) that are electrically coupled to the through substrate metal vias to distribute a DC bias and local oscillator (LO) and information signals; and dicing the multi-wafer stack to form a plurality of array core blocks in which a fluid circulates through the micro-channels and through substrate via holes to cool the RFIC and MMIC Power Amplifier.

19. The method of claim 18, wherein the through substrate via holes are fabricated to receive fluid at both the top and bottom of the stack, said fluid undergoing a phase change to gas as it circulates through the micro-channels and the gas is extracted heated at both the top and bottom of the stack.

20. The method of claim 18, wherein each MC chip and each MIMIC Power Amplifier chip have a circuit side and a backside, wherein the circuit sides are bonded facing each other to minimize the length of the through substrate metal vias that connect the RFIC chip to the MIMIC Power Amplifier chip, wherein the micro-channels are only fabricated on the backside of the RFIC chip.

* * * * *